United States Patent
Shigenobu et al.

(10) Patent No.: US 8,634,061 B2
(45) Date of Patent: Jan. 21, 2014

(54) EXPOSURE APPARATUS AND DEVICE MANUFACTURING METHOD

(75) Inventors: Atsushi Shigenobu, Utsunomiya (JP); Toshiyuki Yoshihara, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 577 days.

(21) Appl. No.: 12/787,037

(22) Filed: May 25, 2010

(65) Prior Publication Data

US 2010/0302524 A1 Dec. 2, 2010

(30) Foreign Application Priority Data

May 26, 2009 (JP) .................................. 2009-125933

(51) Int. Cl.
*G03B 27/52* (2006.01)
*G03F 7/20* (2006.01)

(52) U.S. Cl.
CPC ............ *G03F 7/70266* (2013.01); *G03F 7/706* (2013.01); *G03F 7/705* (2013.01)
USPC .............................................. 355/55; 355/53

(58) Field of Classification Search
CPC . G03F 7/70591; G03F 7/706; G03F 7/70266; G03F 7/70258; G03F 7/70508; G03F 7/705
USPC ...................... 355/30, 52, 53, 55, 67; 356/124
See application file for complete search history.

(56) References Cited

U.S. PATENT DOCUMENTS

| 7,075,651 | B2 | 7/2006 | Tsukakoshi |
| 7,230,692 | B2 | 6/2007 | Fukagawa et al. |
| 7,301,615 | B2 | 11/2007 | Fukagawa et al. |
| 2009/0103065 | A1* | 4/2009 | Yoshihara et al. .............. 355/52 |

FOREIGN PATENT DOCUMENTS

| JP | 11-176744 A | 7/1999 |
| JP | 2002-367886 A | 12/2002 |
| JP | 2005-268451 A | 9/2005 |
| WO | 02/054036 A1 | 7/2002 |

* cited by examiner

*Primary Examiner* — Steven H Whitesell Gordon
(74) *Attorney, Agent, or Firm* — Rossi, Kimms & McDowell LLP

(57) ABSTRACT

An exposure apparatus for exposing a substrate to a light comprises a projection optical system including an optical element and configured to project a light from an original onto the substrate, an adjusting device configured to adjust at least one of a position, an orientation and a shape of the optical element, and a controller configured to obtain an adjusting amount of the optical element based on a value of an objective function relating to an optical characteristic of the projection optical system, and to control the adjusting device based on the obtained adjusting amount. The objective function includes a variable which represents an upper limit of the adjusting amount.

11 Claims, 3 Drawing Sheets

EXPOSURE APPARATUS AND DEVICE MANUFACTURING METHOD

BACKGROUND OF THE INVENTION

1. Field of the Invention

The present invention relates to an exposure apparatus for exposing a substrate to a light.

2. Description of the Related Art

A projection optical system which constitutes an exposure apparatus needs to achieve a good optical characteristic such as various kinds of aberrations. Therefore, the optical characteristic of the projection optical system is measured and an adjusting amount (a correction amount) for adjusting the optical characteristic is calculated based on the measured optical characteristic to perform an appropriate adjustment based on the calculated adjusting amount. The optical characteristic of the projection optical system changes in proportion to the adjusting amount of each element (for example, an optical element such as a lens) which constitutes the projection optical system. Japanese Patent Laid-open No. 2002-367886 discloses a technology of determining the adjusting amount of each element using a linear programming.

The optical characteristics of the projection optical system also contain a characteristic represented by a weighted sum of squares of a wavefront aberration coefficient at each point in an image plane (an exposure region), as is the case with a square of a wavefront aberration RMS value. Japanese Patent Laid-open No. 2005-268451 discloses a technology that optimizes a primary estimation value (an optical characteristic value that is represented by a linear function of an adjusting amount of each element) and a quadratic estimation value (an optical characteristic value that is represented by a quadratic function) in a balanced manner. Japanese Patent Laid-open No. 11-176744 and International Publication No. 02/054036 disclose different technologies of adjusting the optical characteristic of the projection optical system.

However, a conventional method of adjusting the projection optical system calculates an adjusting amount as an optimized solution so that an adjustment target (an objective function) in a predetermined constraint range is minimized. Therefore, the adjusting amount of the projection optical system can be freely changed in the constraint range. However, in the adjustment method, there is a possibility that a large adjusting amount is necessary in order to improve a minute adjustment target that has a comparatively small influence even if there is a solution where the adjustment target is equal to or less than a target value with a small adjusting amount. If the adjusting amount becomes large, an adjustment error increases in proportion to the adjusting amount and an adjusting amount margin in other adjustment processes cannot be obtained. Therefore, the achievement of the targeted optical characteristic with a smaller adjusting amount is required.

BRIEF SUMMARY OF THE INVENTION

The present invention provides, for example, an exposure apparatus which is advantageous in terms of adjusting of an optical characteristic of a projection optical system.

An exposure apparatus as one aspect of the present invention is an exposure apparatus for exposing a substrate to a light. The apparatus comprises a projection optical system including an optical element and configured to project a light from an original onto the substrate, an adjusting device configured to adjust at least one of a position, an orientation and a shape of the optical element, and a controller configured to obtain an adjusting amount of the optical element based on a value of an objective function relating to an optical characteristic of the projection optical system, and to control the adjusting device based on the obtained adjusting amount. The objective function includes a variable which represents an upper limit of the adjusting amount.

Further features and aspects of the present invention will become apparent from the following description of exemplary embodiments with reference to the attached drawings.

DETAILED DESCRIPTION OF THE PREFERRED EMBODIMENTS

Figure 1:
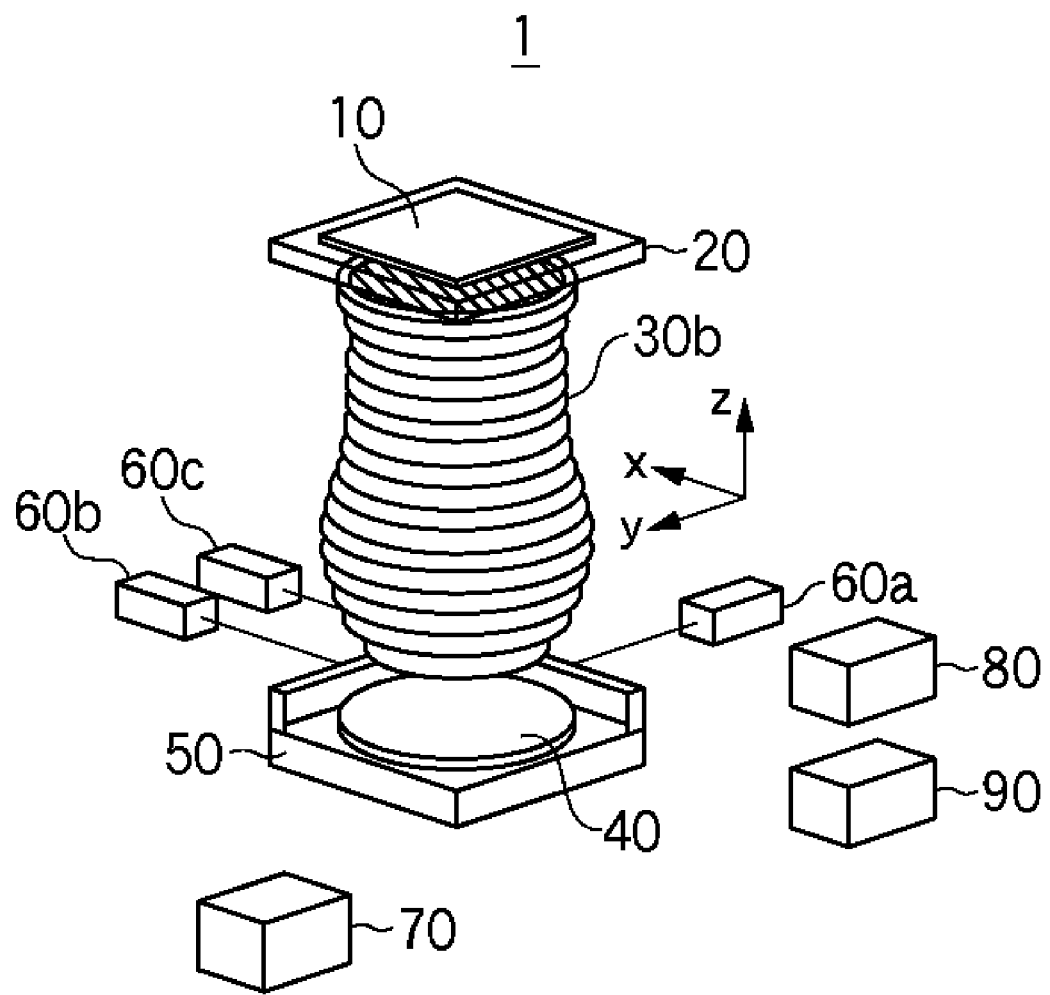
FIG. 1 is a schematic configuration diagram of an exposure apparatus in the present embodiment.

Exemplary embodiments of the present invention will be described below with reference to the accompanied drawings. In each of the drawings, the same elements will be denoted by the same reference numerals and the duplicate descriptions thereof will be omitted.

First, an exposure apparatus in the embodiment of the present invention will be described. FIG. 1 is a schematic configuration diagram of an exposure apparatus 1 in the present embodiment. The exposure apparatus 1 is a projection optical apparatus which exposes a wafer 40 (a substrate) using a pattern on a reticle 10 (an original plate) by a step-and-scan method. However, the present embodiment is not limited to this, and can also be applied to an exposure apparatus of another exposure method such as a step-and-repeat method.

The exposure apparatus 1 includes an illumination optical system (not shown), a reticle stage 20 that holds a reticle 10, a projection optical system 30, a wafer stage 50 that holds a wafer 40, laser interferometers 60a, 60b, and 60c, a measurement device 70, adjusting device 80, and a controller 90. The illumination optical system (not shown) illuminates the reticle 10 on which a circuit pattern is formed, using a light beam from a light source such as a KrF excimer laser having a wavelength of around 248 nm, an ArF excimer laser having a wavelength of around 193 nm, or an F2 laser having a wavelength of around 157 nm.

The reticle 10 has the circuit pattern, and is supported on and driven by the reticle stage 20. Diffracted light generated from the reticle 10 is projected onto the wafer 40 via the projection optical system 30. The reticle stage 20 supports the reticle 10 and moves the reticle 10 using for example a linear motor. The reticle stage 20 is controlled by the controller 90 so as to be able to adjust at least one of a position and an inclination of the reticle 10.

The projection optical system 30 is an optical system which includes a plurality of optical elements (for example, an optical element such as a lens or an aperture stop) and is used for projecting the pattern on the reticle 10 onto the wafer 40. A part of the plurality of optical elements included in the projection optical system 30 is configured so that at least one of the position, the inclination, and the shape of the optical element can be adjusted by the adjusting device 80.

The wafer 40 is a substrate onto which the pattern of the reticle 10 is projected (transferred). However, the wafer 40 can also be replaced with another substrate such as a glass plate. The wafer stage 50 supports the wafer 40 and moves the wafer 40 by using for example a linear motor. The wafer stage 50 is controlled by the controller 90 so that at least one of the position and the inclination of the wafer 40 can be adjusted. The laser interferometers 60a to 60c are disposed near the wafer stage 50 to measure a position of the wafer stage 50.

The measurement device 70 measures an optical characteristic of the exposure apparatus 1, particularly of the projection optical system 30. The measurement device 70 includes for example an interferometer or a light intensity sensor, and measures a wavefront aberration at each point in an exposure region of the projection optical system 30. In addition, the measurement device 70 measures a distortion as an aberration of the projection optical system 30. The distortion means for example a displacement of a real image height with respect to an ideal image height on an image plane, and it can be measured at each point on the image plane (in the exposure region). The structure and the motion of the measurement device 70 are well known, and therefore descriptions thereof are omitted.

The adjusting device 80 is controlled by the controller 90, and adjusts at least one of the position, the inclination, and the shape of a part of the plurality of optical elements included in the projection optical system 30. The adjusting device 80 is configured by including for example a mechanism that drives in an optical axis direction (a Z-axis direction in FIG. 1) and directions perpendicular to the optical axis (X-axis and Y-axis directions), a mechanism that drives a support member which supports the optical element, and a mechanism that applies a stress (a force pushing or pulling the optical element) to the optical element.

The controller 90 includes a CPU or a memory (not shown) to control various kinds of operations of the exposure apparatus 1. The controller 90 controls for example scanning velocity of the reticle stage 20 or the wafer stage 50. In addition, the controller 90 calculates an adjusting amount of the optical element of the projection optical system 30 by the adjustment member 80 or an adjusting amount of the reticle stage 20 or the wafer stage 50, based on a measurement result of the measurement member 70. These adjusting amounts are calculated using for example a linear programming, or a quadratic programming or a quadratic cone programming described below. In addition, the controller 90 controls the adjustment member 80, or the reticle stage 20 or the wafer stage 50, based on the adjusting amount of the optical element of the projection optical system 30, or the adjusting amount of the reticle stage 20 or the wafer stage 50 which are calculated by the programming. The detail of a method of calculating the adjusting amount of the projection optical system 30 (the optical element) or the reticle stage 20 or the wafer stage 50 by the controller 90 will be described below.

Figure 2:
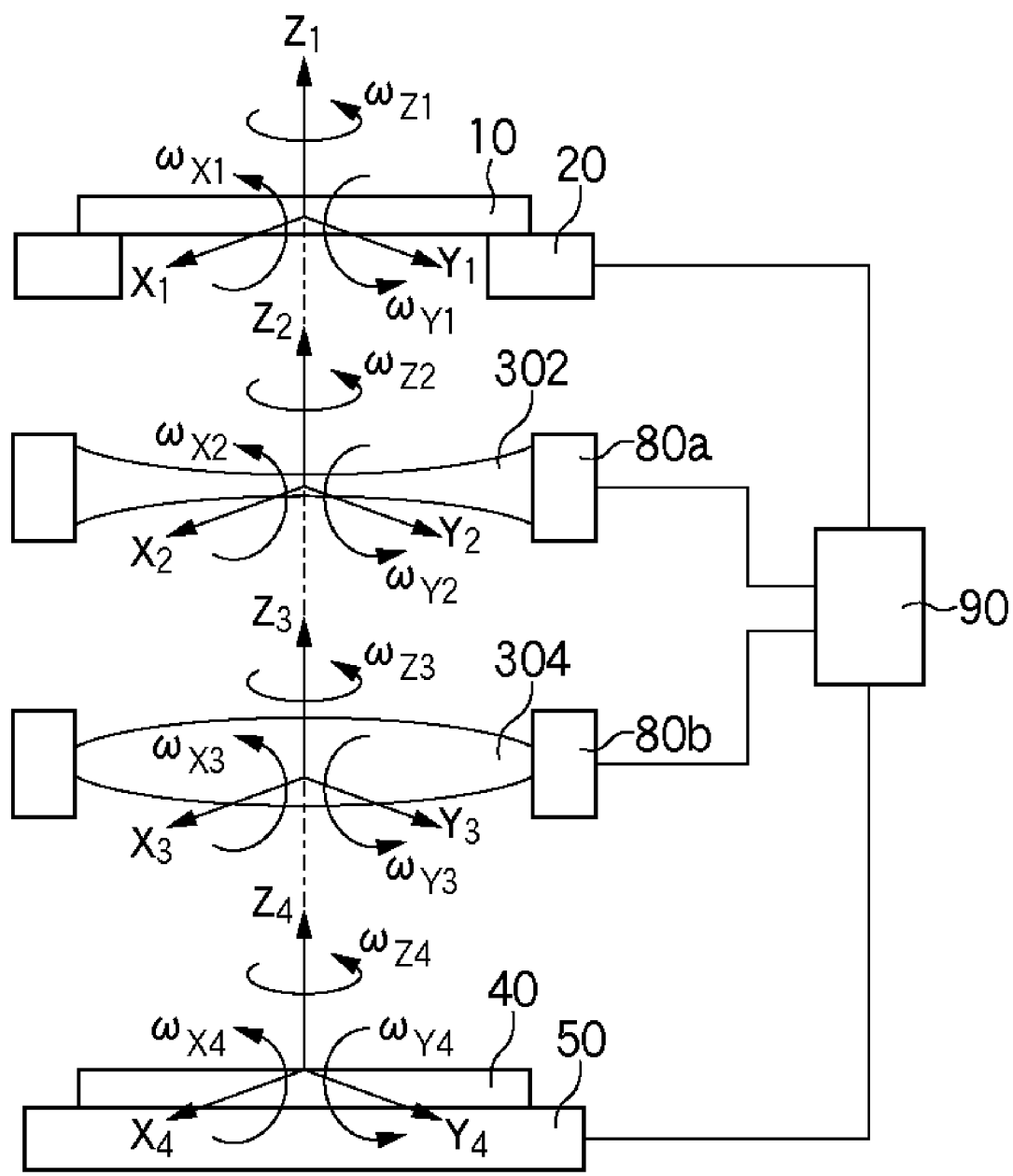
FIG. 2 is a diagram showing a movable direction of a position adjustable portion in an exposure apparatus in the present embodiment.

FIG. 2 is a diagram showing a movable direction of a position adjustable portion in the exposure apparatus 1 of the present embodiment. FIG. 2 shows, as an example, movable directions (drive directions) of the reticle 10, the wafer 40, and the optical elements 302 and 304 included in the projection optical system 30 whose position are adjustable.

The position of the reticle 10 is adjusted in directions of six degrees of freedom, i.e. directions of arrows $X_1, Y_1, Z_1, \omega_{X1}, \omega_{Y1},$ and $\omega_{Z1}$, via the reticle stage 20 by the controller 90. Similarly, the position of the wafer 40 is adjusted in directions of six degrees of freedom, i.e. directions of arrows $X_4, Y_4, Z_4, \omega_{X4}, \omega_{Y4},$ and $\omega_{Z4}$, via the wafer stage 50 by the controller 90. The position of the optical element 302 is adjusted in directions of six degrees of freedom, i.e. directions of arrows $X_2, Y_2, Z_2, \omega_{X2}, \omega_{Y2},$ and $\omega_{Z2}$, via a drive mechanism 80a constituting a part of the adjustment member 80 by the controller 90. Similarly, the position of the optical element 304 is adjusted in directions of six degrees of freedom, i.e. directions of arrows $X_3, Y_3, Z_3, \omega_{X3}, \omega_{Y3},$ and $\omega_{Z3}$, via a drive mechanism 80b constituting another part of the adjustment member 80 by the controller 90.

[First Embodiment]

Figure 3:
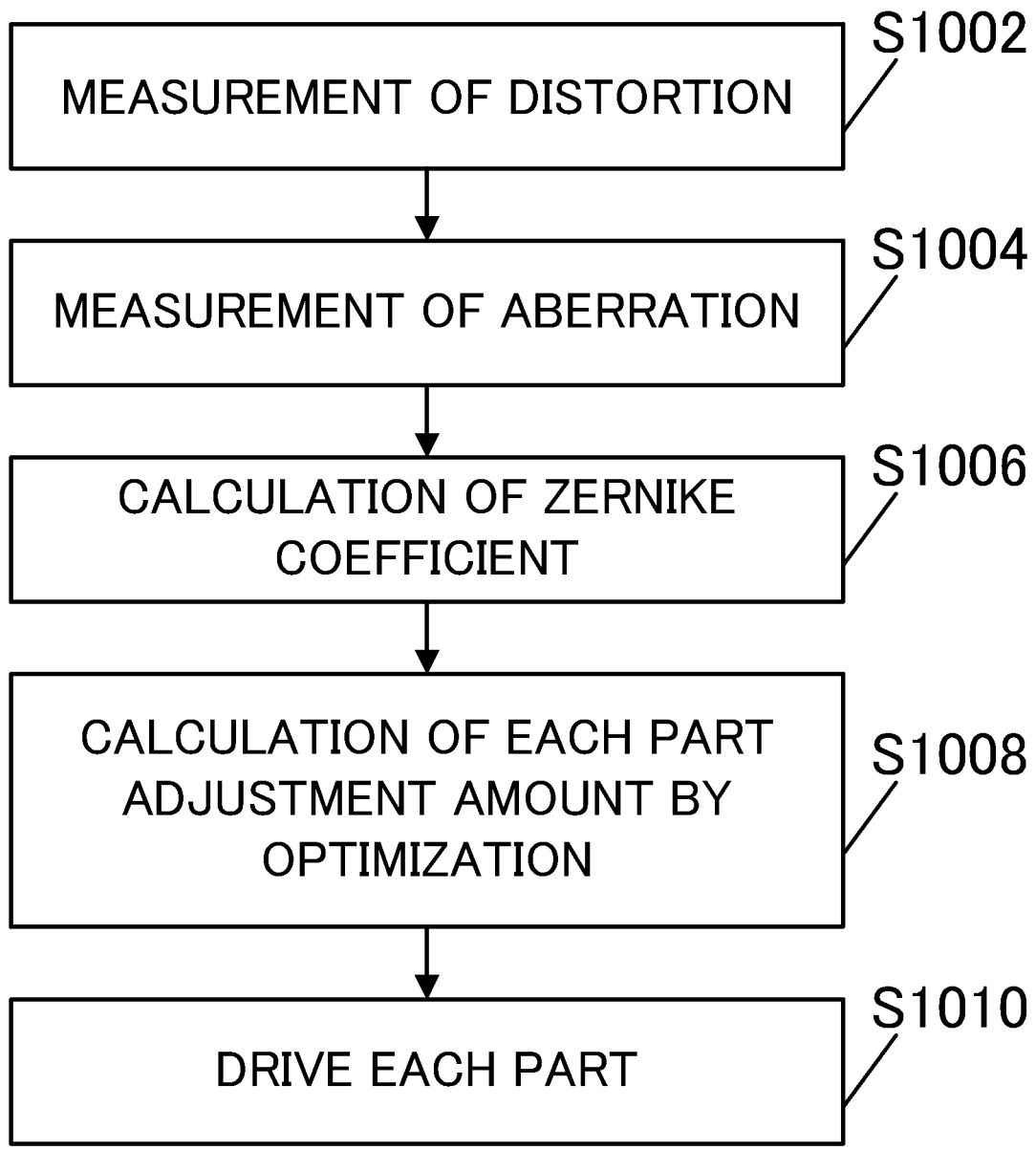
FIG. 3 is a flow chart of adjusting a projection optical system of an exposure apparatus in the first embodiment.

Next, an optical characteristic (for example, a wavefront aberration) of the projection optical system 30 in the first embodiment will be described. FIG. 3 is a flow chart of adjusting the projection optical system 30 in the present embodiment. In the present embodiment, the adjustment of the projection optical system 30 is performed based on an instruction from the controller 90.

As shown in FIG. 3, first in Step S1002, the measurement member 70 measures a distortion of the projection optical system 30. Next, in Step S1004, the measurement member 70 measures an aberration (a wavefront aberration) of the projection optical system 30. Specifically, it measures the wavefront aberration at each of measurement points of H locations in the exposure region of the projection optical system 30.

Next, in Step S1006, the controller 90 expands the wavefront aberration of a measurement point h in the exposure region of the projection optical system 30 measured in Step S1004 by J Zernike orthogonal functions to calculate each of Zernike coefficients $Z_{jh}$. Thus, an optical characteristic value having a primary characteristic with respect to a line width asymmetry, a curvature of field, or a wavefront aberration amount such as astigmatism can be calculated from the Zernike coefficient (the wavefront aberration amount) of each of the measurement points of H locations in the exposure region of the projection optical system 30. Such an optical characteristic value is represented by a linear function of the adjusting amount of the reticle stage 20, the wafer stage 50, or the optical element 302 or 304. In the present embodiment, the optical characteristic value is referred to as a primary optical characteristic value.

A square value of j-th Zernike coefficient $Z_{jh}$ at the measurement point h in the exposure region of the projection optical system 30, and an optical characteristic value represented by a sum of products of a weight coefficient of each Zernike component, for example a square of a wavefront aberration RMS (Root Means Square) value (a value of a means square of a wavefront aberration), can be calculated. Such an optical characteristic value is represented by a quadratic function of the adjusting amount of the reticle stage 20, the wafer stage 50, or the optical element 302 or 304. In the present embodiment, the optical characteristic value is referred to as a quadratic optical characteristic value.

Next, the primary optical characteristic value, the quadratic optical characteristic value, the adjusting amount, and the distortion will be described. Indexes h, j, k, and m used in the following description are defined by the following Expressions (1) to (5), respectively.

$$h=1, 2, \ldots, H \tag{1}$$

$$i=1, 2, \ldots, I \tag{2}$$

$$j=1, 2, \ldots, J \tag{3}$$

$$k=1, 2, \ldots, K \tag{4}$$

$$m=1, 2, \ldots, M \tag{5}$$

The i-th primary optical characteristic value $y_{ih}$ at the measurement point h in the exposure region of the projection optical system 30 is, as indicated by Expression (6), represented by a linear combination of the Zernike coefficients.

Further, when the adjusting amount of each part (the reticle stage 20, the wafer stage 50, or the optical element 302 or 304) is changed, the j-th Zernike coefficient $Z_{jh}$ at the measurement point h is, as indicated by Expression (7), represented by a linear combination of k-th each part adjusting amount $x_k$. In Expression (6), $a_{ij}$ is an influence rate of the j-th Zernike coefficient with respect to the i-th primary optical characteristic value. In Expression (7), $Z_{0jh}$ is an initial value of the j-th Zernike coefficient at the measurement point h, and $b_{hjk}$ is an influence rate of the each part adjusting amount $x_k$ to the j-th Zernike coefficient at the measurement point h.

$$y_{ih} = \sum_{j=1}^{J} a_{ij} z_{jh} \quad (i = 1, 2, \ldots, I; \quad h = 1, 2, \ldots, H) \quad (6)$$

$$z_{jh} = z_{0jh} + \sum_{k=1}^{K} b_{hjk} x_k \quad (j = 1, 2, \ldots, J; \quad h = 1, 2, \ldots, H) \quad (7)$$

The following Expression (8) can be introduced using the above Expressions (6) and (7).

$$y_{ih} = \sum_{j=1}^{J} a_{ij} z_{0jh} + \sum_{k=1}^{K} \sum_{j=1}^{J} a_{ij} b_{hjk} x_k \quad (8)$$

$$(i = 1, 2, \ldots, I; \quad h = 1, 2, \ldots, H)$$

A distortion $u_h$ at the measurement point h is also the primary optical characteristic value that is represented by a linear function with respect to the k-th each part adjusting amount $x_k$. Accordingly, when the adjusting amount of each part (the reticle stage 20, the wafer stage 50, or the optical element 302 or 304) is changed, the distortion $u_h$ at the measurement point h is, as indicated by the following Expression (9), represented by a linear combination of the k-th each part adjusting amount $x_k$. In Expression (9), $u_{0h}$ is an initial value of the distortion at the measurement point h, and $c_{hk}$ is an influence rate of the each part adjusting amount $x_k$ to the distortion at the measurement point h.

$$u_h = u_{0h} + \sum_{k=1}^{K} c_{hk} x_k \quad (h = 1, 2, \ldots, H) \quad (9)$$

On the other hand, the m-th quadratic optical characteristic value $w_{mh}$, at the measurement point h in the exposure region of the projection optical system 30 is represented by the following Expression (10). In Expression (10), $d_{jm}$, is an influence rate of the j-th Zernike coefficient with respect to the m-th quadratic optical characteristic value.

$$w_{mh} = \sum_{j=1}^{J} d_{jm} z_{jm}^2 \quad (m = 1, 2, \ldots, M; \quad h = 1, 2, \ldots, H) \quad (10)$$

Based on the above Expressions (10) and (7), as described below, Expression (11) that indicates M quadratic optical characteristic values $w_{mh}$, at the measurement point h is introduced.

$$w_{mh} = \sum_{j=1}^{J} d_{jm} \left( z_{0jh} + \sum_{k=1}^{K} b_{hjk} x_k \right)^2 \quad (11)$$

$$(m = 1, 2, \ldots, M; \quad h = 1, 2, \ldots, H)$$

Since the each part adjusting amount $x_k$ has a physical limit value, the each part adjusting amount $x_k$ is represented by the following Expression (12). In Expression (12), $L_k$ is a lower limit value of the k-th each part adjusting amount, and $U_k$ is an upper limit value of the k-th each part adjusting amount.

$$L_k \leq x_k \leq U_k \ (k=1, 2, \ldots, K) \quad (12)$$

Next, in Step S1008, the controller 90 generates a constraint conditional expression for minimizing the primary optical characteristic value, the distortion, the adjusting amount, and the quadratic optical characteristic value, using the quadratic programming (a constraint quadratic programming). The controller 90 calculates the adjusting amount of each part (for example, adjusting amounts of the optical elements 302 and 304) using the generated constraint conditional expression.

Hereinafter, a processing in Step S1008 will be specifically described. First, for adjustment ranges of the primary optical characteristic value, the distortion, and the adjusting amount of each part, constraint conditions of the linear programming using dummy variables proposed in International Publication No. 02/054036 are represented by the following expressions (13) to (23). In other words, Expressions (13) to (23) are constraint conditions of an optimization problem.

$$\sum_{j=1}^{J} a_{ij} z_{0jh} + \sum_{k=1}^{K} \sum_{j=1}^{J} a_{ij} b_{hjk} x_k \leq t_{1i} \quad (13)$$

$$(i = 1, 2, \ldots, I; \quad h = 1, 2, \ldots, H)$$

$$-\sum_{j=1}^{J} a_{ij} z_{0jh} - \sum_{k=1}^{K} \sum_{j=1}^{J} a_{ij} b_{hjk} x_k \leq t_{1i} \quad (14)$$

$$(i = 1, 2, \ldots, I; \quad h = 1, 2, \ldots, H)$$

$$u_{0h} + \sum_{k=1}^{K} c_{hk} x_k \leq t_2 \ (h = 1, 2, \ldots, H) \quad (15)$$

$$-u_{0h} - \sum_{k=1}^{K} c_{hk} x_k \leq t_2 \ (h = 1, 2, \ldots, H) \quad (16)$$

$$x_k \leq t_{3k} \ (k = 1, 2, \ldots, K) \quad (17)$$

$$-x_k \leq t_{3k} \ (k = 1, 2, \ldots, K) \quad (18)$$

$$0 \leq t_{1i} \ (i = 1, 2, \ldots, I) \quad (19)$$

$$0 \leq t_2 \quad (20)$$

$$0 \leq t_{3k} \ (k = 1, 2, \ldots, K) \quad (21)$$

$$-x_k \leq -L_k \ (k = 1, 2, \ldots, K) \quad (22)$$

$$x_k \leq U_k \ (k = 1, 2, \ldots, K) \quad (23)$$

In the embodiment, $t_{1i}$ at the right-hand side of the above Expression (19) and $t_2$ at the right-hand side of the above Expression (20) are dummy variables (first dummy variables) which correspond to the upper limit value of the primary optical characteristic value. Further, $t_{3k}$ at the right-hand side of the above expression (21) is a dummy variable (a second dummy variable) as an upper limit of the adjusting amount. On the other hand, in order to minimize the quadratic optical characteristic value which is represented by a weighted sum of squares of the Zernike coefficients by the constraint quadratic programming, an upper limit $Z_{ajh}$ of an absolute value of the j-th Zernike coefficient at the measurement point h is represented by the following Expressions (24) and (25).

$$z_{0jh} + \sum_{k=1}^{K} b_{hjk} x_k \leq z_{ajh} \quad (24)$$
$$(j = 1, 2, \ldots, J;\ h = 1, 2, \ldots, H)$$

$$-z_{0jh} - \sum_{k=1}^{K} b_{hjk} x_k \leq z_{ajh} \quad (25)$$
$$(j = 1, 2, \ldots, J;\ h = 1, 2, \ldots, H)$$

As is obvious from Expressions (24) and (25), the upper limit $Z_{ajh}$ is always positive (not negative). If the constraint expressions represented by the following Expressions (26) to (28) are added, it is a constraint quadratic programming problem that can calculate an optimized solution. Therefore, the worst value of the quadratic optical characteristic value in the exposure region of the projection optical system 30 can be minimized.

$$\sum_{j=1}^{J} d_{jm} z_{0jh} z_{0jh} \leq t_{4m}\ (m = 1, 2, \ldots, M;\ h = 1, 2, \ldots, H) \quad (26)$$

$$0 \leq z_{ajh}\ (j = 1, 2, \ldots, J;\ h = 1, 2, \ldots, H) \quad (27)$$

$$0 \leq t_{4m}\ (m = 1, 2, \ldots, M) \quad (28)$$

In the embodiment, $t_{4m}$ at the right-hand side of each of Expressions (26) and (28) is a dummy variable (a third dummy variable) which corresponds to the upper limit value of the quadratic optical characteristic value.

Thus, a constraint quadratic programming problem which is represented by the following Expression (29) is made. In Expression (29), $Y_i$ is a permissible value of the i-th primary optical characteristic value, U is a permissible value of the distortion, S is a permissible value of the adjusting amount, and $W_m$ is a permissible value of the m-th quadratic optical characteristic value. The first to fourth terms at the right-hand side of Expression (29) represent the waveform aberration, the distortion, the adjusting amount, and the RMS value, respectively.

$$f = \frac{1}{Y_i} \sum_{i=1}^{I} t_{1i} + \frac{1}{U} t_2 + \frac{1}{S} \sum_{k=1}^{K} t_{3k} + \frac{1}{W_m} \sum_{m=1}^{M} t_{4m} \quad (29)$$

It is preferable that an objective function $f$ represented by Expression (29) is normalized by dividing each optical characteristic value by the permissible value in order to optimize each optical characteristic of the projection optical system 30 in a balanced manner. Thus, a plurality of aberrations can be minimized in a balanced manner. In the present embodiment, each value is determined so that the objective function $f$ represented by Expression (29) is minimized. In this case, it is necessary to satisfy the constraint conditions represented by the above Expressions (13) to (28).

The controller 90 calculates the adjusting amount of each part (the reticle stage 20, the wafer stage 50, or the optical element 302 or 304) using the above Expressions (13) to (29). The controller 90 calculates the adjusting amount of the above each part before it controls the adjusting device 80 so as to drive each part based on the calculated adjusting amount in Step S1010. Thus, the optical characteristic of the projection optical system 30 is adjusted, i.e. the aberration of the projection optical system 30 is corrected.

The constraint quadratic programming problem which has been formulated necessarily has an optimized solution and it is able to be solved. Accordingly, if an optimized calculation using a calculation program of the constraint quadratic programming (a constraint quadratic programming solver) based on the above formulation method, the adjusting amount (control variable) of each part for minimizing the worst values of the primary optical characteristic value and the quadratic optical characteristic value can be calculated.

[Second Embodiment]

Next, a method of adjusting an optical characteristic (for example, a waveform aberration) of the projection optical system 30 in the second embodiment will be described. In the present embodiment, the adjustment of the projection optical system 30 is performed by using a quadratic cone programming. In the present embodiment, the measurement of the distortion of the projection optical system 30 (Step S1002), the measurement of the waveform aberration of the projection optical system 30 (Step S1004), and the calculation of the Zernike coefficient (Step S1006) are the same as the processes of the flow chart shown in FIG. 3.

In the present embodiment, a process of Step S1008A (not shown) that is different from Step S1008 shown in FIG. 3 is performed. In Step S1008A, the controller 90 generates a primary optical characteristic value, a distortion, a quadratic optical characteristic value, and a constraint conditional expression for minimizing an adjustment value using the quadratic cone programming to calculate the adjusting amount of each part (for example, the adjusting amount of the optical element 302 or 304). Specifically, since Expressions (13) to (29) in the first embodiment are deformed toward equivalent Expressions (30) to (47) as represented below, it is the quadratic cone programming problem and the optimized solution can be calculated. Therefore, the worst value of the quadratic optical characteristic value in the exposure region of the projection optical system 30 can be minimized.

$$f = \frac{1}{Y_i} \sum_{i=1}^{I} t_{1i} + \frac{1}{U} t_2 + \frac{1}{S} \sum_{k=1}^{K} t_{3k} + \frac{1}{W_m} \sum_{m=1}^{M} t_{4m} \quad (30)$$

$$0 \leq -\sum_{k=1}^{K} \sum_{j=1}^{J} a_{ij} b_{hjk} x_k + t_{1i} - \sum_{j=1}^{J} a_{ij} z_{0jh} \quad (31)$$
$$(i = 1, 2, \ldots, I;\ h = 1, 2, \ldots, H)$$

$$0 \leq \sum_{k=1}^{K} \sum_{j=1}^{J} a_{ij} b_{hjk} x_k + t_{1i} + \sum_{j=1}^{J} a_{ij} z_{0jh} \quad (32)$$
$$(i = 1, 2, \ldots, I;\ h = 1, 2, \ldots, H)$$

$$0 \leq -\sum_{k=1}^{K} c_{hk} x_k + t_2 - u_{0h}\ (h = 1, 2, \ldots, H) \quad (33)$$

$$0 \leq \sum_{k=1}^{K} c_{hk} x_k + t_2 + u_{0h}\ (h = 1, 2, \ldots, H) \quad (34)$$

-continued $$0 \le t_{3k} - x_k \quad (k = 1, 2, \ldots, K) \quad (35)$$

$$0 \le t_{3k} + x_k \quad (k = 1, 2, \ldots, K) \quad (36)$$

$$\left\| \begin{pmatrix} B_{hm} & 0 \\ -\frac{\alpha_{hm}}{2} & \frac{1}{2} \\ 0 \\ -\frac{\beta_{hm}+1}{2} \end{pmatrix} \begin{pmatrix} s \\ t_{4m} \end{pmatrix} + \begin{pmatrix} 0 \\ \frac{\beta_{hm}+1}{2} \end{pmatrix} \right\| \le \left( -\frac{\alpha_{hm}^T}{2} \quad \frac{1}{2} \right) \begin{pmatrix} s \\ t_{4m} \end{pmatrix} + \frac{-\beta_{hm}+1}{2} \quad (37)$$

$$(m = 1, 2, \ldots, M; \quad h = 1, 2, \ldots, H)$$

$$0 \le t_{1i} \quad (i = 1, 2, \ldots, I) \quad (38)$$

$$0 \le t_2 \quad (39)$$

$$0 \le t_{3k} \quad (k = 1, 2, \ldots, K) \quad (40)$$

$$0 \le t_{4m} \quad (m = 1, 2, \ldots, M) \quad (41)$$

$$-x_k \le -L_k \quad (k = 1, 2, \ldots, K) \quad (42)$$

$$x_k \le U_k \quad (k = 1, 2, \ldots, K) \quad (43)$$

In the above Expression (37), s, $B_{hm}$, $\alpha_{hm}$, and $\beta_{hm}$ are represented by the following Expressions (44) to (47), respectively.

$$s = \begin{pmatrix} x_1 \\ x_2 \\ \vdots \\ x_k \end{pmatrix} \quad (44)$$

$$B_{hm} = \begin{pmatrix} d_{1m}b_{h11} & d_{1m}b_{h12} & \cdots & d_{1m}b_{h1K} \\ d_{2m}b_{h21} & d_{2m}b_{h22} & \cdots & d_{2m}b_{h2K} \\ \vdots & \vdots & \cdots & \vdots \\ d_{Jm}b_{hJ1} & d_{Jm}b_{hJ2} & \cdots & d_{Jm}b_{hJK} \end{pmatrix} \quad (45)$$

$$(m = 1, 2, \ldots, M; \quad h = 1, 2, \ldots, H)$$

$$\alpha_{hm} = \begin{pmatrix} 2\sum_{j=1}^{J} d_{jm}^2 b_{hj1} z_{0jh} \\ 2\sum_{j=1}^{J} d_{jm}^2 b_{hj2} z_{0jh} \\ \vdots \\ 2\sum_{j=1}^{J} d_{jm}^2 b_{hjK} z_{0jh} \end{pmatrix} \quad (46)$$

$$(m = 1, 2, \ldots, M; \quad h = 1, 2, \ldots, H)$$

$$\beta_{hm} = \sum_{j=1}^{J} d_{jm}^2 z_{0jh}^2 \quad (m = 1, 2, \ldots, M; \quad h = 1, 2, \ldots, H) \quad (47)$$

As described above, Expressions (30) to (47) are deformations of Expressions (13) to (29) in the first embodiment and are the quadratic cone programming problem which has variables $\{x_k, t_{1i}, t_2, t_3, \text{and } t_4\}$. In the present embodiment, each value is determined so as to minimize the objective function $f$ represented by Expression (30). In this case, constraint conditions represented by the above expressions (31) to (47) need to be satisfied. The controller 90 calculates the adjusting amount of each part (the reticle stage 20, the wafer stage 50, and the optical elements 302 and 304) based on Expressions (30) to (47). In Step S1010, the controller 90 calculates the adjusting amount of each part (the reticle stage 20, the wafer stage 50, and the optical elements 302 and 304) before driving each part. Thus, the optical characteristic of the projection optical system 30 is adjusted, i.e. the aberration of the projection optical system 30 is corrected.

The constraint quadratic programming problem which has been formulated necessarily has an optimized solution and it is able to be solved. Accordingly, if an optimized calculation using a calculation program of the quadratic cone programming (a constraint quadratic cone programming solver) based on the above formulation method, the adjusting amount (control variable) of each part for minimizing the worst values of the primary optical characteristic value and the quadratic optical characteristic value can be calculated. Further, in the exposure apparatus of the present embodiment, the number of the control variables is not large and the above calculation is finished in a short time. Accordingly, when the aberration is corrected in real time in the exposure apparatus, high throughput can be stably maintained.

A device (a semiconductor integrated circuit device, a liquid crystal display device, or the like) is manufactured by a process of exposing a substrate (a wafer, a glass plate, or the like) which is coated by a photosensitizing agent using an exposure apparatus in any one of the above embodiments, a process of developing the substrate, and other well-known processes.

According to each of the above embodiments, an exposure apparatus which suppresses an adjusting amount of an optical element and also achieves a good optical characteristic can be provided. Further, a device manufacturing method with high reliability can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-125933, filed on May 26, 2009, which is hereby incorporated by reference herein in its entirety.

What is claimed is:

1. An exposure apparatus for exposing a substrate to a light, the apparatus comprising:
   a projection optical system including an optical element and configured to project a light from an original onto the substrate;
   an adjusting device configured to adjust at least one of a position, an orientation, or a shape of the optical element; and
   a controller configured to obtain an adjusting amount of the optical element based on a value of an objective function relating to an optical characteristic of the projection optical system, and to control the adjusting device based on the obtained adjusting amount,
   wherein the objective function includes a variable which represents an upper limit for an absolute value of the adjusting amount.

2. An exposure apparatus according to claim 1, wherein the objective function further includes a variable which represents an upper limit for a linear optical characteristic value of the projection optical system represented by a linear function of the adjusting amount, and a variable which represents an upper limit for a quadratic optical characteristic value of the projection optical system represented by a quadratic function of the adjusting amount.

3. An exposure apparatus according to claim 1, wherein the controller is configured to obtain the adjusting amount, by which the value of the objective function is minimized, using a quadratic programming or a quadratic cone programming.

4. An exposure apparatus according to claim 2, wherein the linear optical characteristic value includes an optical characteristic value which is represented by a linear combination of wavefront aberration coefficients.

5. An exposure apparatus according to claim 2, wherein the linear optical characteristic value includes a value of a distortion as an aberration of the projection optical system.

6. An exposure apparatus according to claim 2, wherein the quadratic optical characteristic value includes an optical characteristic value which is represented by a weighted sum of squares of wavefront aberration coefficients.

7. An exposure apparatus according to claim 2, wherein the quadratic optical characteristic value includes a value of a mean squares of wavefront aberrations.

8. An exposure apparatus according to claim 4, wherein the wavefront aberration coefficient includes a Zernike coefficient.

9. An exposure apparatus according to claim 1, further comprising:
a stage configured to hold one of the original or the substrate and to adjust at least one of a position or an orientation of the one of the original or the substrate,
wherein the controller is configured to obtain an adjusting amount of the stage based on a value of the objective function, and to control an operation of the stage based on the obtained adjusting amount.

10. An exposure apparatus according to claim 1, wherein the objective function is represented by a linear combination of the variable which represents the upper limit for the absolute value of the adjusting amount and a variable which represents an upper limit for an optical characteristic value of the projection optical system represented by a function of the adjusting amount.

11. A method of manufacturing a device, the method comprising the steps of:
exposing a substrate to a light using an exposure apparatus;
developing the exposed substrate; and
processing the developed substrate to manufacture the device,
wherein the exposure apparatus comprises:
a projection optical system including an optical element and configured to project a light from an original onto the substrate;
an adjusting device configured to adjust at least one of a position, an orientation, or a shape of the optical element; and
a controller configured to obtain an adjusting amount of the optical element based on a value of an objective function relating to an optical characteristic of the projection optical system, and to control the adjusting device based on the obtained adjusting amount,
wherein the objective function includes a variable which represents an upper limit of an absolute value for the adjusting amount.

* * * * *